(12) United States Patent
Nakamura et al.

(10) Patent No.: US 10,530,332 B2
(45) Date of Patent: Jan. 7, 2020

(54) RESONATOR AND RESONATING DEVICE

(71) Applicant: Murata Manufacturing Co., Ltd., Nagaokakyo-shi, Kyoto-fu (JP)

(72) Inventors: Daisuke Nakamura, Nagaokakyo (JP); Hiroshi Nakatani, Nagaokakyo (JP)

(73) Assignee: MURATA MANUFACTURING CO., LTD., Nagaokakyo-shi, Kyoto-fu (JP)

( * ) Notice: Subject to any disclaimer, the term of this patent is extended or adjusted under 35 U.S.C. 154(b) by 415 days.

(21) Appl. No.: 15/453,173

(22) Filed: Mar. 8, 2017

(65) Prior Publication Data

US 2017/0179922 A1 Jun. 22, 2017

Related U.S. Application Data

(63) Continuation of application No. PCT/JP2015/079546, filed on Oct. 20, 2015.

(30) Foreign Application Priority Data

Oct. 22, 2014 (JP) .................. 2014-215333

(51) Int. Cl.
*H03H 9/17* (2006.01)
*H03H 9/02* (2006.01)
(Continued)

(52) U.S. Cl.
CPC ........ *H03H 9/172* (2013.01); *H03H 9/02259* (2013.01); *H03H 9/0504* (2013.01); *H03H 9/2405* (2013.01); *H03H 2009/241* (2013.01)

(58) Field of Classification Search
CPC .. H03H 9/172; H03H 9/02259; H03H 9/0504; H03H 9/2405; H03H 9/6493; H03H 9/0211; H03H 9/0519; H03H 2009/241
See application file for complete search history.

(56) References Cited

U.S. PATENT DOCUMENTS 5,369,862 A * 12/1994 Kotani ............... H03H 3/04
29/25.35
5,701,048 A * 12/1997 Kaida ............... H03H 9/0595
310/321

(Continued)

FOREIGN PATENT DOCUMENTS

JP H07-7361 A 1/1995
JP 2004-243462 A 9/2004

(Continued)

OTHER PUBLICATIONS

International Search Report issued in International Application No. PCT/JP2015/079546, dated Dec. 22, 2015.

(Continued)

*Primary Examiner* — J. San Martin
(74) *Attorney, Agent, or Firm* — Arent Fox LLP

(57) ABSTRACT

A resonator is provided that suppresses vibration of a retainer caused by undesired vibration of a vibrating portion and also achieves size reduction. Specifically, the resonator includes a vibrating member that includes a semiconductor layer, a first piezoelectric film formed on the semiconductor layer, and a first upper electrode formed on the first piezoelectric film. Moreover, a retainer is provided to retain the vibrating member such that the vibrating portion can vibrate and one or more coupling members are provided to couple the vibrating member to the retainer. Finally, the resonator includes a vibration suppressing member that includes a second piezoelectric film formed on the retainer and a second upper electrode formed on the second piezoelectric film.

20 Claims, 6 Drawing Sheets

(51) Int. Cl.
*H03H 9/05* (2006.01)
*H03H 9/24* (2006.01)

(56) References Cited

U.S. PATENT DOCUMENTS

| | | | |
|---|---|---|---|
| 7,990,232 B1 | 8/2011 | Lee | |
| 9,287,488 B2 | 3/2016 | Hiraoka et al. | |
| 2005/0046504 A1* | 3/2005 | Xiaoyu | G02B 26/0841 331/154 |
| 2005/0200240 A1* | 9/2005 | Tanaka | H03H 9/02086 310/333 |
| 2010/0156566 A1 | 6/2010 | Abdolvand et al. | |
| 2011/0133848 A1* | 6/2011 | Ayazi | H03B 5/326 331/158 |
| 2011/0141046 A1* | 6/2011 | Sato | G06F 3/016 345/173 |
| 2012/0306321 A1* | 12/2012 | Ishii | H03H 9/0542 310/348 |
| 2014/0368087 A1 | 12/2014 | Hiraoka et al. | |
| 2016/0028369 A1* | 1/2016 | Yamamoto | H03B 28/00 331/158 |
| 2019/0165760 A1* | 5/2019 | Shimura | H03H 9/0519 |

FOREIGN PATENT DOCUMENTS

| | | |
|---|---|---|
| JP | 2008/166903 A | 7/2008 |
| WO | WO 2004/032320 A1 | 4/2004 |
| WO | WO 2013/114857 A1 | 8/2013 |

OTHER PUBLICATIONS

Written Opinion of the International Searching Authority issued in International Application No. PCT/JP2015/079546, dated Dec. 22, 2015.

* cited by examiner

RESONATOR AND RESONATING DEVICE

CROSS REFERENCE TO RELATED APPLICATIONS

The present application is a continuation of PCT/JP2015/079546 filed Oct. 20, 2015, which claims priority to Japanese Patent Application No. 2014-215333, filed Oct. 22, 2014, the entire contents of each of which are incorporated herein by reference.

TECHNICAL FIELD

The present disclosure relates generally to a resonator and a resonating device.

BACKGROUND

Electronic devices use a resonator as a device for providing a time keeping function. As electronic devices become smaller, demand for smaller resonators increases. Accordingly, resonators manufactured using a micro electro mechanical systems (MEMS) technique attract attention.

In such a MEMS resonator, a retainer retains a vibrating portion, with a coupling portion interposed therebetween, such that the vibrating portion can vibrate. Conventionally, various measures have been taken in such a resonator to prevent vibration of the vibrating portion from being transmitted to the retainer as leakage vibration.

For example, Patent Document 1 (identified below) discloses a resonator using width-expansion vibration, in which a retaining arm connected to a node has a dynamic damper structure to suppress leakage of vibration to a retainer. Patent Document 2 (identified below) discloses a technique in which an auxiliary arm and a coupling portion are added between a contour resonator and a retainer to prevent leakage of vibration.

Patent Document 1: Japanese Unexamined Patent Application Publication No. 7-7361.

Patent Document 2: Japanese Unexamined Patent Application Publication No. 2008-166903.

In Patent Documents 1 and 2, undesired vibration from a vibrating portion is suppressed by a coupling portion, which has an auxiliary portion for absorbing vibration to prevent leakage of vibration from the vibrating portion to the retainer. However, this designs makes the shape of the coupling portion complex and increases the size of the coupling portion, and, therefore, it is difficult to reduce the size of the entire resonator. There is also a problem of reduced strength of the coupling portion.

SUMMARY OF THE INVENTION

The present disclosure has been made in view of the circumstances described above. An object of the present disclosure is to provide a resonator and a resonating device in which vibration of a retainer caused by undesired vibration of a vibrating portion can be suppressed and the size of the vibrating portion can be reduced.

As disclosed herein, an exemplary resonator includes a vibrating portion including a semiconductor layer, a first piezoelectric film formed on the semiconductor layer, and a first upper electrode formed on the first piezoelectric film. Moreover, the resonator includes a retainer configured to retain the vibrating portion such that the vibrating portion can vibrate; a coupling portion configured to couple the vibrating portion to the retainer; and a vibration suppressing portion formed on the retainer and including a second piezoelectric film and a second upper electrode formed on the second piezoelectric film.

According to the present disclosure, a resonator and a resonating device is provided that suppress vibration of a retainer caused by undesired vibration of a vibrating portion and also achieves size reduction compared with conventional resonator designs.

DETAILED DESCRIPTION OF EXEMPLARY EMBODIMENTS

Exemplary embodiments of the present disclosure will now be described with reference to the drawings.

First Embodiment (Configuration)

Figure 1:
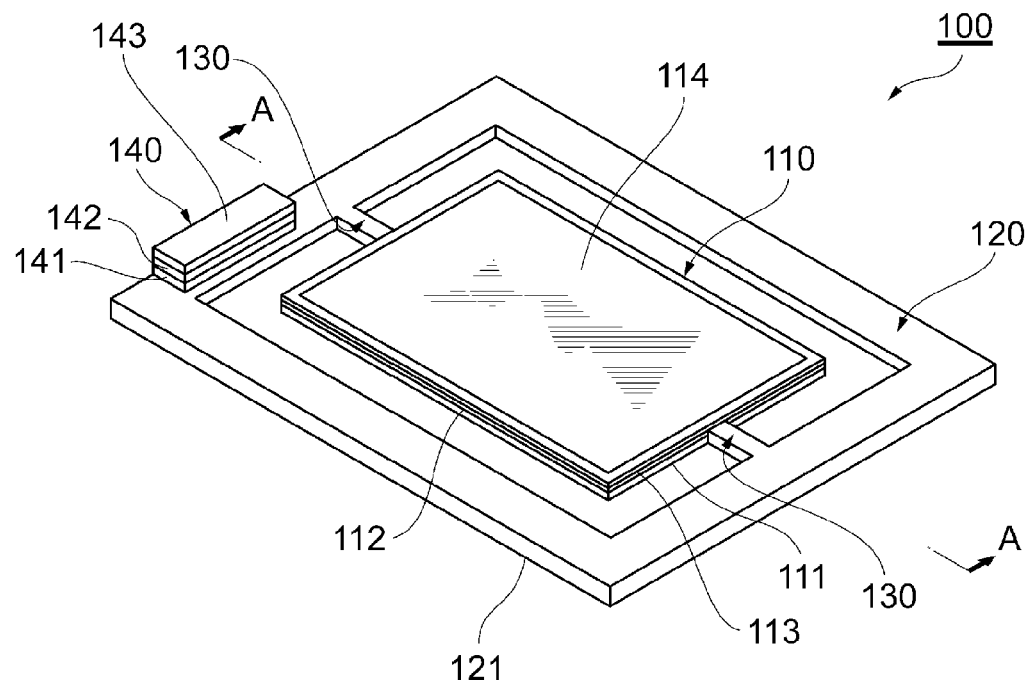
FIG. 1 is a perspective view illustrating an overall configuration of a piezoelectric resonator according to a first embodiment.
Figure 2:
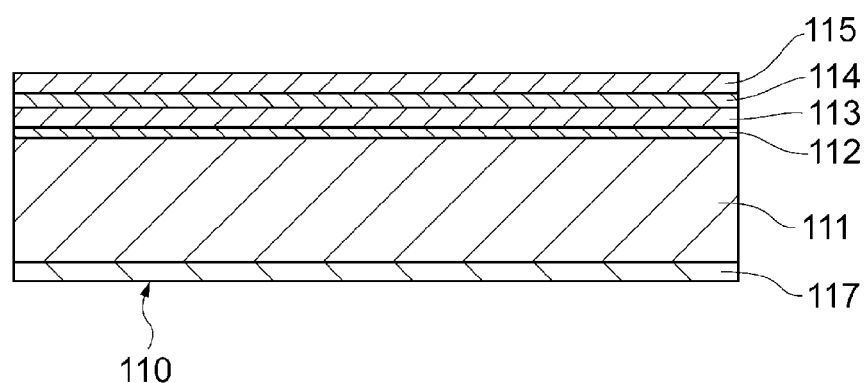
FIG. 2 is a cross-sectional view taken along line A-A of the piezoelectric resonator illustrated in FIG. 1.
Figure 3:
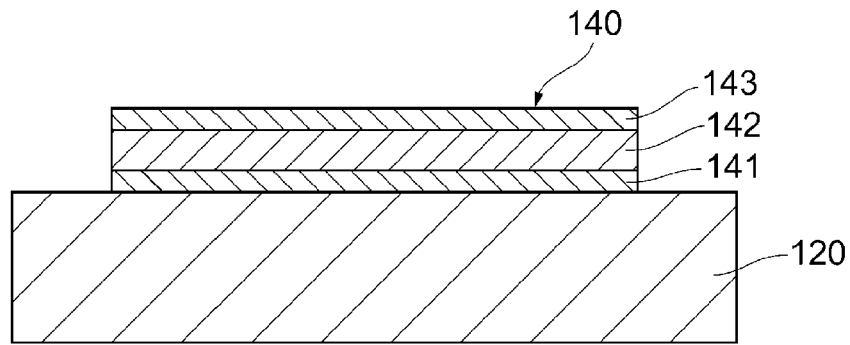
FIG. 3 is a partial cross-sectional view of a retainer and a vibration suppressing portion of the piezoelectric resonator illustrated in FIG. 1.

FIG. 1 is a perspective view illustrating an overall configuration of a piezoelectric resonator 100 (an example of resonator) according to a first embodiment. FIG. 2 is a cross-sectional view taken along line A-A in FIG. 1 and illustrating another form of a vibrating portion 110 included in the piezoelectric resonator 100. FIG. 3 is a lateral cross-sectional view illustrating a layered structure of part of a retainer 120 and a vibration suppressing portion 140 included in the piezoelectric resonator 100.

As illustrated in FIG. 1, the piezoelectric resonator 100 includes the vibrating member 110 (also referred to as a vibrating portion), the retainer 120, two coupling members 130 (also referred to as a coupling portion) that connect the vibrating portion 110 to the retainer 120, and the vibration suppressing member 140 (also referred to as a vibration suppressing member) disposed on the retainer 120.

The vibrating portion 110 is a width-expansion vibration resonator having a rectangular shape in plan view. The vibrating portion 110 is formed by stacking upward a lower electrode 112 (that can correspond to a first lower electrode in an exemplary embodiment), a piezoelectric film 113 (that can correspond to a first piezoelectric film in an exemplary embodiment), and an upper electrode 114 (that can correspond to a first piezoelectric film in an exemplary embodiment) on a semiconductor layer 111. In the present embodiment, the semiconductor layer 111 is a degenerate semiconductor made of silicon. The semiconductor layer 111 is, for example, 10 µm thick, 140 µm wide in the short-side direction, and 200 µm long in the longitudinal direction. The lower electrode 112 is formed, for example, using a metal material, such as molybdenum (Mo) or aluminum (Al), and is 0.1 µm thick. The piezoelectric film 113 is a thin piezoelectric film that converts an applied voltage to vibration, and is, for example, 0.8 µm thick. The piezoelectric film 113 can be mainly composed of a nitride, such as aluminum nitride, or an oxide. Specifically, the piezoelectric film 113 can be made of scandium aluminum nitride (ScAlN). ScAlN is obtained by substituting scandium (Sc) for part of aluminum (Al) in aluminum nitride (AlN). Like the lower electrode 112 described above, the upper electrode 114 is formed, for example, using a metal material, such as molybdenum (Mo) or aluminum (Al), and is 0.1 µm thick. The vibrating portion 110 is coupled to the retainer 120, with the coupling portions 130 interposed therebetween, at end portions (nodes) of the vibrating portion 110 along the center line in the direction of vibration of the width-expansion vibration resonator, and is retained by the retainer 120. By controlling the ratio between the length in the longitudinal direction and the width in the short-side direction, the vibrating portion 110 can realize a width-expansion vibration fundamental wave resonator that does not cause much undesired vibration.

As in the A-A cross section illustrated in FIG. 2, the vibrating portion 110 may be obtained by forming a film for frequency adjustment. That is, a frequency adjusting film 115 may be formed on the upper electrode 114. This makes it possible to achieve efficient frequency adjustment. Also, as illustrated in FIG. 2, a temperature characteristic correcting film 117 made of silicon oxide (e.g., $SiO_2$) may be formed under the semiconductor layer 111 made of silicon, on the opposite side of the piezoelectric film 113. This makes it possible to achieve good temperature characteristics.

The retainer 120 is a frame-like member with a rectangular shape in plan view. Like the semiconductor layer 111, the retainer 120 can be formed by a degenerate semiconductor made of silicon.

In one aspect, the coupling portions 130 can be formed simultaneously with the semiconductor layer 111 of the vibrating portion 110 and the retainer 120. As described above, the coupling portions 130 are configured to couple the vibrating portion 110 to the retainer 120 at nodes in the direction of vibration of the width-expansion vibration resonator. Like the semiconductor layer 111 and the retainer 120, the coupling portions 130 can be formed by a degenerate semiconductor made of silicon.

As illustrated in FIG. 1, the vibration suppressing portion 140 is formed on part of the retainer 120. The vibration suppressing portion 140 may be positioned at any location on the surface of the retainer 120, but is preferably positioned in the vicinity of either of the coupling portions 130.

As in FIG. 1 and the cross section illustrated in FIG. 3, the vibration suppressing portion 140 is formed by stacking a lower electrode 141 (an example of second lower electrode), a piezoelectric film 142 (an example of second piezoelectric film), and an upper electrode 143 (an example of second upper electrode). The lower electrode 141, the piezoelectric film 142, and the upper electrode 143 have the same configuration as the lower electrode 112, the piezoelectric film 113, and the upper electrode 114. That is, the lower electrode 141 is formed using a metal material, such as molybdenum (Mo) or aluminum (Al), and is 0.1 µm thick. The lower electrode 141 may be formed as the same layer as the lower electrode 112. The piezoelectric film 142 is a thin piezoelectric film that converts an applied voltage to vibration, and is, for example, 0.8 µm thick. The piezoelectric film 142 can be mainly composed of an aluminum nitride. Specifically, the piezoelectric film 142 can be made of scandium aluminum nitride (ScAlN). Like the lower electrode 141, the upper electrode 143 is formed, for example, using molybdenum (Mo) or aluminum (Al), and is 0.1 µm thick. The upper electrode 143 may be formed as the same layer as the upper electrode 114.

As described above, the semiconductor layer 111 of the vibrating portion 110, the retainer 120, and the coupling portions 130 are formed by a degenerate semiconductor made of silicon according to the exemplary embodiment. More specifically, the semiconductor layer 111, the retainer 120, and the coupling portions 130 can be integrally formed by processing a highly-doped degenerate silicon substrate in the processes of photolithography and etching. For example, by using an n-type degenerate silicon substrate doped with phosphorus (P) as the highly-doped degenerate silicon substrate, good frequency-temperature characteristics can be achieved.

The lower electrode 112, the piezoelectric film 113, and the upper electrode 114 of the vibrating portion 110 and the lower electrode 141, the piezoelectric film 142, and the upper electrode 143 of the vibration suppressing portion 140 are each obtained by patterning, with photolithography or etching, a film formed by sputtering or the like. It is generally preferable that the upper and lower electrodes of the vibrating portion be formed on the entire surface of the piezoelectric film for stable oscillation. However, the electrodes may be partly formed when degradation in reliability caused by reduced insulation properties at end portions of the electrodes is taken into consideration.

The lower electrode 112, the piezoelectric film 113, and the upper electrode 114 of the vibrating portion 110 and the lower electrode 141, the piezoelectric film 142, and the upper electrode 143 of the vibration suppressing portion 140 may be formed simultaneously. By simultaneously forming the piezoelectric films and the upper and lower electrodes described above, the process of manufacturing the piezoelectric resonator 100 can be simplified. Additionally, since the upper and lower electrodes and the piezoelectric film of the vibrating portion 110 and those of the vibration suppressing portion 140 are level with each other, it is easy to control the height of the piezoelectric resonator 100 when upper and lower covers are joined together to seal the piezoelectric resonator 100 from both sides, as described below with reference to FIG. 7.

(Operation and Effect)

In the piezoelectric resonator 100 configured as described above, the vibration suppressing portion 140 is formed on the retainer 120. This makes it possible to suppress vibration even when vibration generated in the vibrating portion 110 is transmitted through the coupling portions 130 to the retainer 120 as undesired vibration.

That is, when the piezoelectric film 142 of the vibration suppressing portion 140 bends and vibrates in response to vibration from the vibrating portion 110, electric charges corresponding to vibration strain are generated in the piezoelectric film 142. Since this vibration is bending vibration based on width-expansion vibration of the vibrating portion 110, which is a rectangular plate, the harmonics of the bending vibration are easily excited and positive and negative electric charges are alternately generated in the piezoelectric film 142 of the vibration suppressing portion 140. Therefore, when the upper electrode 143 and the lower electrode 141 formed on the upper and lower sides of the piezoelectric film 142 cancel out the electric charges, the energy of undesired vibration can be consumed and the vibration can be suppressed.

Figure 4:
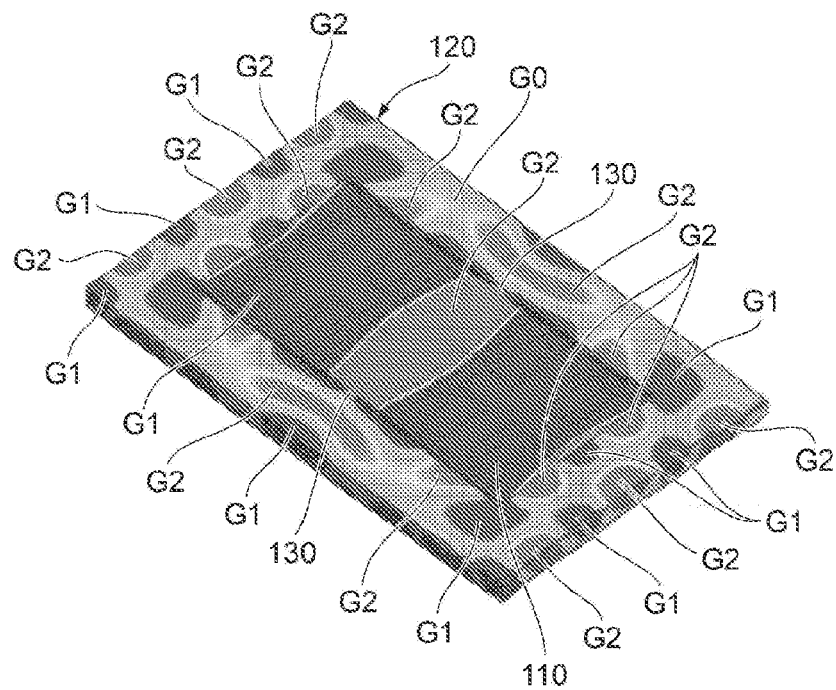
FIG. 4 illustrates a comparative example for explaining an effect of the piezoelectric resonator according to the first embodiment.
Figure 5:
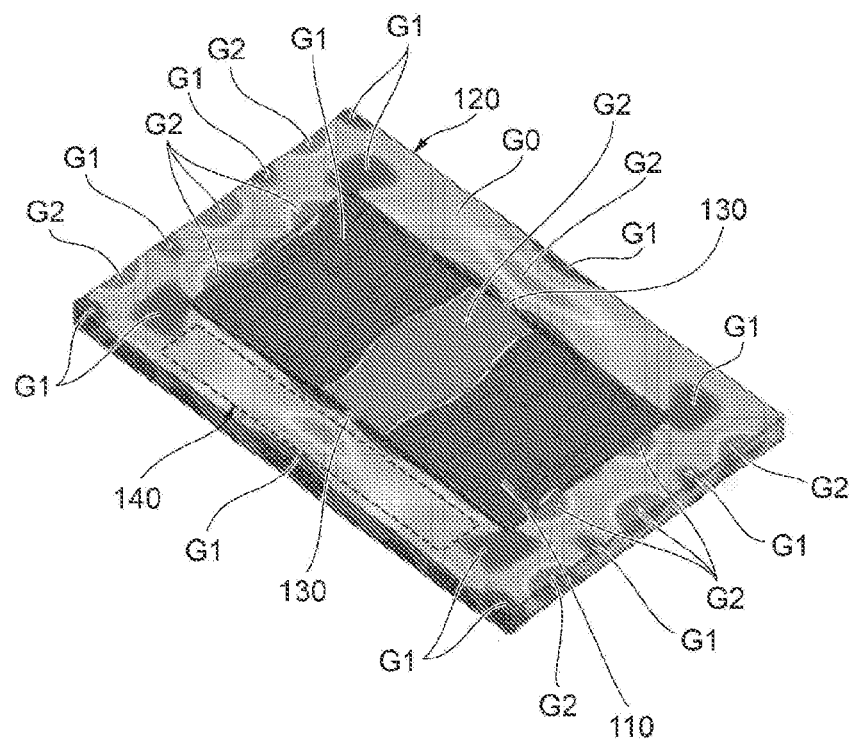
FIG. 5 illustrates the effect of the piezoelectric resonator according to the first embodiment.

For the third harmonics of a width-expansion vibration resonator based on finite element method (FEM) simulation, FIGS. 4 and 5 provide computer illustrations showing the effect of vibration suppression achieved by cancellation of electric charges in the vibration suppressing portion 140.

FIG. 4 illustrates an example without the vibration suppressing portion 140. FIG. 5 illustrates an example where the vibration suppressing portion 140 is formed along the longitudinal direction of the retainer 120, in the vicinity of one of connecting portions with the coupling portions 130.

In FIGS. 4 and 5, color tones representing vibration displacements in the thickness direction are replaced with grayscale colors. Specifically, amplitude G1 corresponds to blue that represents maximum displacement in the negative direction (with an amplitude from −1.0 nm to −0.5 nm), amplitude G2 corresponds to red that represents maximum displacement in the positive direction (with an amplitude from 0.5 nm to 1.0 nm), and amplitude G0 corresponds to green that represents medium displacement (with an amplitude from −0.5 nm to 0.5 nm, hereinafter referred to as amplitude G0). As illustrated in FIG. 4, in the third harmonics of width-expansion vibration, bending displacement in the thickness direction is large in the center of the vibrating portion, and the vibration displacement transmitted through the coupling portions causes the retainer to bend and vibrate in the thickness direction.

The comparison between FIGS. 4 and 5 shows that in the example with the vibration suppressing portion 140 illustrated in FIG. 5, the range of amplitude G1 and amplitude G2 in the retainer 120 is smaller and vibration from the vibrating portion 110 is more suppressed than in the example without the vibration suppressing portion 140 illustrated in FIG. 4.

With the piezoelectric resonator 100 of the present embodiment, it is possible to provide a piezoelectric resonator and a piezoelectric resonating device that can suppress vibration of a retainer caused by undesired vibration of a vibrating portion, and also achieve size reduction compared with existing designs, without changing the shape and structure of coupling portions.

Second Embodiment

Figure 6:
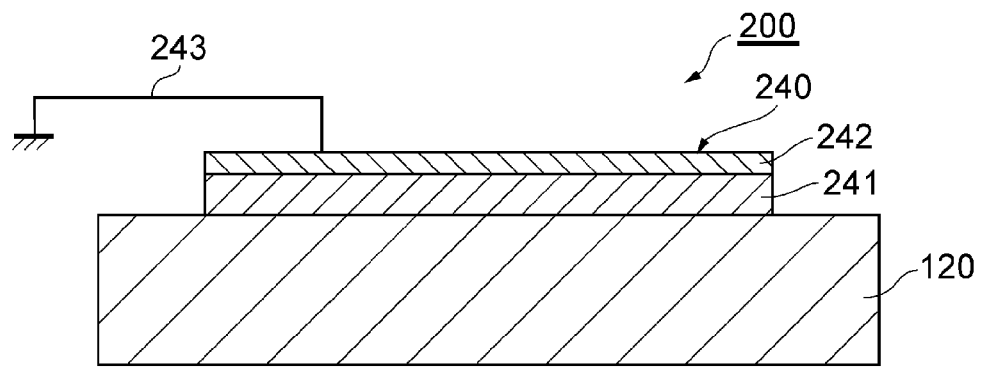
FIG. 6 is a partial cross-sectional view of a retainer and a vibration suppressing portion of a piezoelectric resonator according to a second embodiment.

A piezoelectric resonator according to a second embodiment will be described with reference to FIG. 6. Like FIG. 3, FIG. 6 is a lateral cross-sectional view illustrating a layered structure of part of a retainer and a vibration suppressing portion included in the piezoelectric resonator. It is noted that the same components as those in the first embodiment are denoted by the same reference numerals and their description will be omitted.

As illustrated in FIG. 6, in a piezoelectric resonator 200, a vibration suppressing portion 240 is formed on the retainer 120. The vibration suppressing portion 240 is formed by a piezoelectric film 241 and an upper electrode 242. A ground wire 243 is connected to the upper electrode 242 of the vibration suppressing portion 240, and the upper electrode 242 is grounded by the ground wire 243.

As in the first embodiment, the semiconductor layer 111 of the vibrating portion 110 (not shown in FIG. 6; see FIG. 1), the retainer 120, and the coupling portions 130 (not shown in FIG. 6; see FIG. 1) can be integrally formed by a degenerate semiconductor made of silicon.

In the piezoelectric resonator 200 of the present embodiment, the semiconductor layer 111 of the vibrating portion 110, the retainer 120, and the coupling portions 130 are formed by a degenerate semiconductor made of silicon. This can improve frequency-temperature characteristics, and eliminate the need for forming a lower electrode. It is thus possible to simplify the process of manufacturing the piezoelectric resonator 200. Additionally, the thickness of the piezoelectric resonator 200 can be reduced, as there is no need to form a lower electrode in the vibration suppressing portion 240.

Also, since the upper electrode 242 of the vibration suppressing portion 240 is connected to the ground wire 243, it is possible to efficiently cancel out electric charges, and improve the effect of suppressing undesired vibration.

In the piezoelectric resonator 200 of the present embodiment, it is preferable that the upper electrode 242 on the piezoelectric film 241 formed on the retainer 120 and the upper electrode 114 of the vibrating portion 110 (not shown in FIG. 6; see FIG. 1) be not capacitively coupled to each other. This is because capacitive coupling between these conductors degrades characteristics (k). Therefore, the upper electrode 242 on the piezoelectric film 241 formed on the retainer 120 preferably reduces its area over the retainer 120 without sacrificing its effectiveness, and efficiently cancels out electric charges.

Third Embodiment

Figure 7:
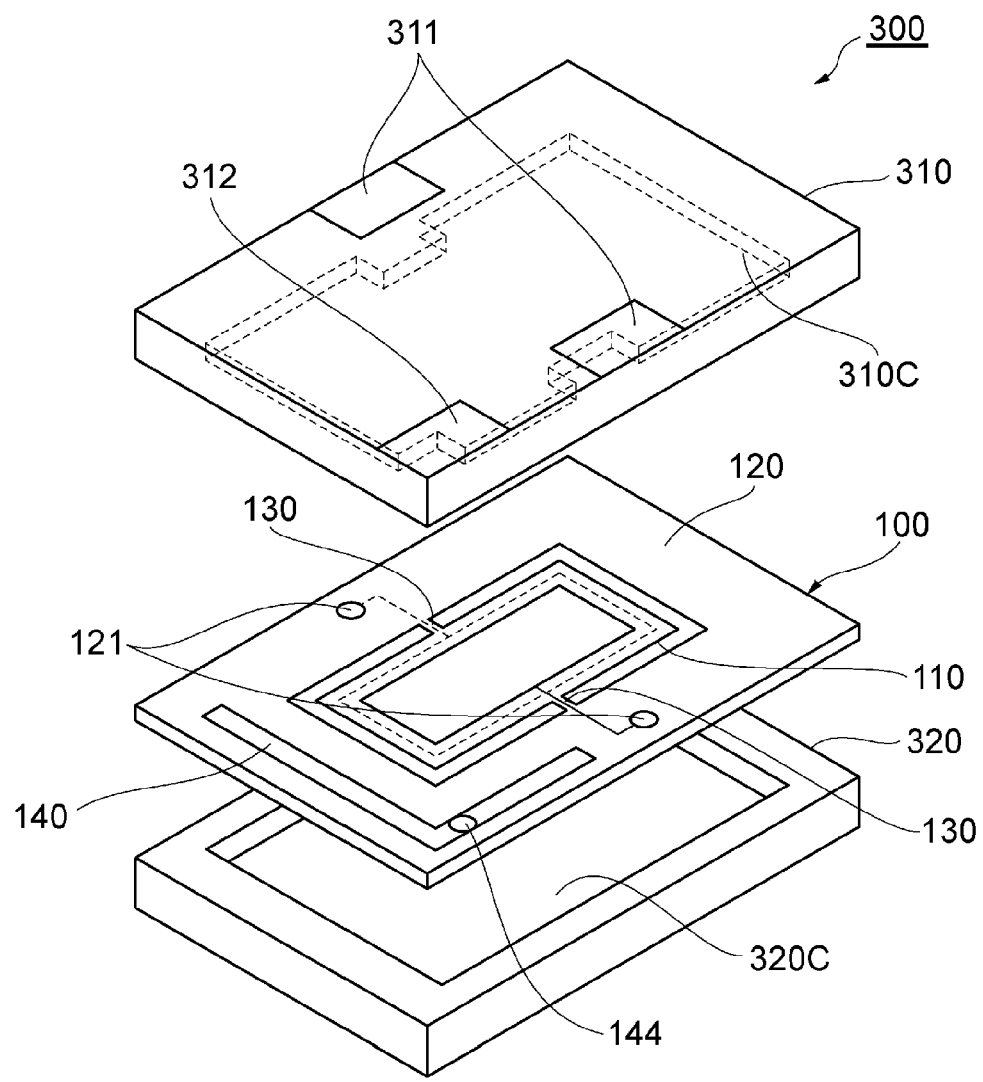
FIG. 7 is an exploded perspective view illustrating an overall configuration of a piezoelectric resonator according to a third embodiment.

A third embodiment relates to a piezoelectric resonating device formed using the piezoelectric resonators according to the first and second embodiments. The third embodiment will be described with reference to FIG. 7. FIG. 7 is an exploded perspective view illustrating an overall configuration of a piezoelectric resonating device 300 (an example of resonating device). It is noted that the same components as those in the first and second embodiments are denoted by the same reference numerals and their description will be omitted.

The piezoelectric resonating device 300 includes the piezoelectric resonator 100 and an upper cover 310 and a lower cover 320 configured to shield the piezoelectric resonator 100 from upper and lower sides of the piezoelectric resonator 100. The upper cover 310 and the lower cover 320 are substrates made of silicon.

The upper cover 310 is rectangular in plan view and has a cavity 310C in the center thereof. The upper cover 310 is provided with a pair of input and output terminals 311 at its end portions in the center on the long sides. The input and output terminals 311 are located at positions vertically corresponding to the respective coupling portions 130 of the piezoelectric resonator 100. The upper cover 310 is also provided with a terminal 312 at a position corresponding to the vibration suppressing portion 140 of the piezoelectric resonator 100. The terminal 312 is for allowing the upper electrode 143 (not shown in FIG. 7; see FIGS. 1 and 3) of the vibration suppressing portion 140 to be connected to a ground wire. The lower cover 320 has a cavity 320C in the center thereof.

The piezoelectric resonator 100 is stored in the cavities 310C and 320C while being shielded by the upper cover 310 and the lower cover 320. Extended portions 121 each electrically extended from the upper electrode 114 or lower electrode 112 of the vibrating portion 110 are formed on the respective coupling portions 130 of the piezoelectric resonator 100. The extended portions 121 are electrically connected to the input and output terminals 311 of the upper cover 310.

The extension from the piezoelectric resonator 100 to the input and output terminals 311 of the upper cover 310 may be made by forming through holes in the upper cover 310.

In the piezoelectric resonating device 300 described above, an end 144 of the electrode formed on the retainer 120 can be extended to the terminal 312 formed on the outer surface of the upper cover 310 through a through hole formed in the upper cover 310 retaining the retainer 120. This facilitates connection from the upper electrode 242 of the vibration suppressing portion 240 to the ground wire, makes it possible to cancel out electric charges more efficiently, and can improve the effect of suppressing undesired vibration.

Other Embodiments

The present disclosure is not limited to the embodiments described above, and may also include additional embodiments, such as the following embodiments. In the piezoelectric resonator 200 described in the second embodiment, since capacitive coupling between the upper electrode 242 on the piezoelectric film 241 formed on the retainer 120 and the upper electrode 114 of the vibrating portion 110 degrades the characteristics (k), the upper electrode 242 on the piezoelectric film 241 formed on the retainer 120 preferably reduces its area over the retainer 120 without sacrificing its effectiveness. On the other hand, since the distribution of electric charges in the piezoelectric resonator varies depending on the mode of undesired vibration, electrodes are preferably arranged such that as wide a variety of distributions of electric charges as possible can be cancelled out.

Figure 8:
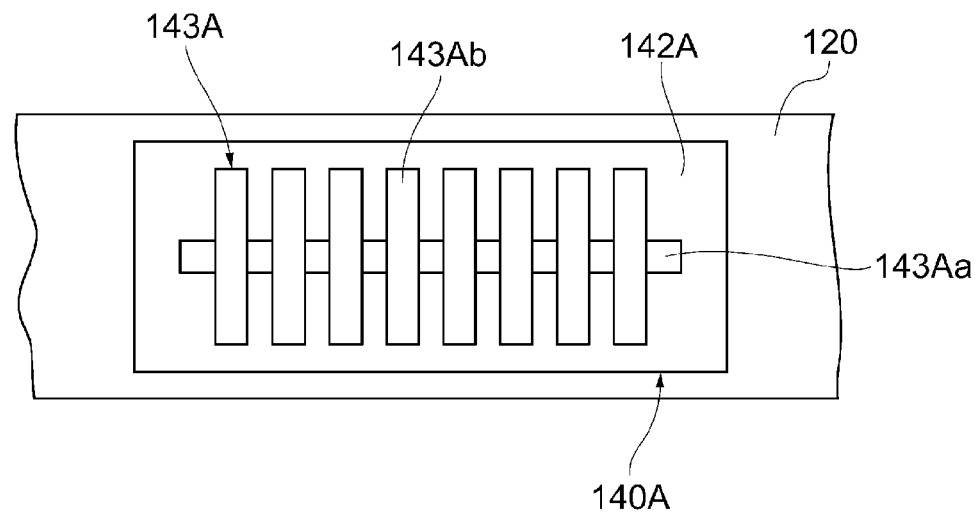
FIG. 8 is a schematic plan view illustrating a configuration of a piezoelectric resonator according to another embodiment.

For example, FIG. 8 illustrates part of the retainer 120 and a vibration suppressing portion 140A. As illustrated, an upper electrode 143A may be disposed on a piezoelectric film 142A such that a belt-like electrode 143Aa extends in the center along the longitudinal direction, and that a plurality of stick-like electrodes 143Ab extend in the short-side direction orthogonal to the belt-like electrode 143Aa. Thus, by forming the upper electrode 143A on the piezoelectric film 142A in a long and continuous manner, various distributions of electric charges can be cancelled out in accordance with changes in the mode of undesired vibration.

Figure 9:
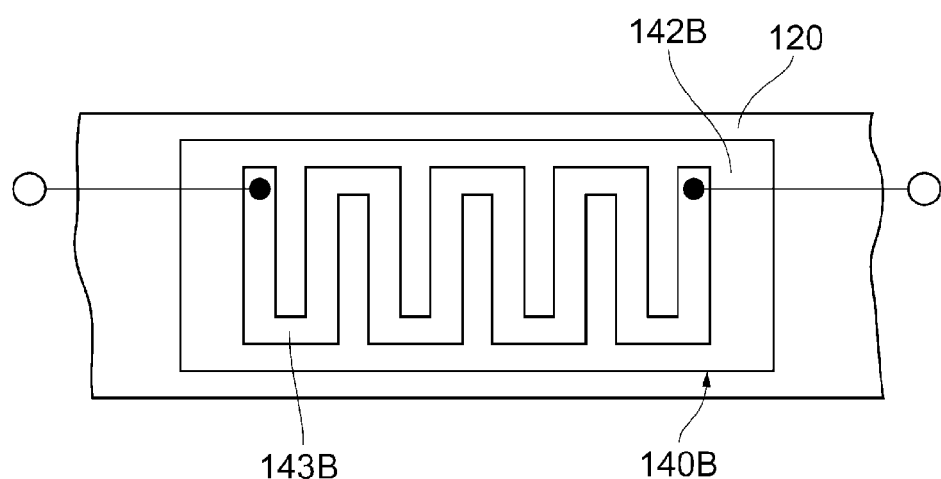
FIG. 9 is a schematic plan view illustrating a configuration of a piezoelectric resonator according to another embodiment.

Also, for example, FIG. 9 illustrates part of the retainer 120 and a vibration suppressing portion 140B. As illustrated, a belt-like upper electrode 143B may meander on a piezoelectric film 142B. Thus, since the upper electrode 143B on the piezoelectric film 142B can be formed in a long and continuous manner, a variety of distributions of electric charges corresponding to a plurality of modes of undesired vibration can be cancelled out. In this embodiment, extension from both ends of the upper electrode 143B on the piezoelectric film 142B to the external terminals on the upper cover 310 illustrated in FIG. 7 makes it possible to provide the function of a temperature sensor.

In the embodiments described above, the crystallinity of the piezoelectric film 142 over the retainer 120 may be lowered. For example, the piezoelectric film 142 can be altered by forming it on the lower electrode 141 whose surface has been roughened by etching. In this case, the half-width of a rocking curve can be widened. As the crystallinity of the piezoelectric film 142 over the retainer 120 decreases, the quality factor decreases. Although vibration leaking to the retainer 120 contains harmonics of various types of bending, decreasing the quality factor makes it possible to suppress vibration in a wider range of frequencies.

Figure 10:
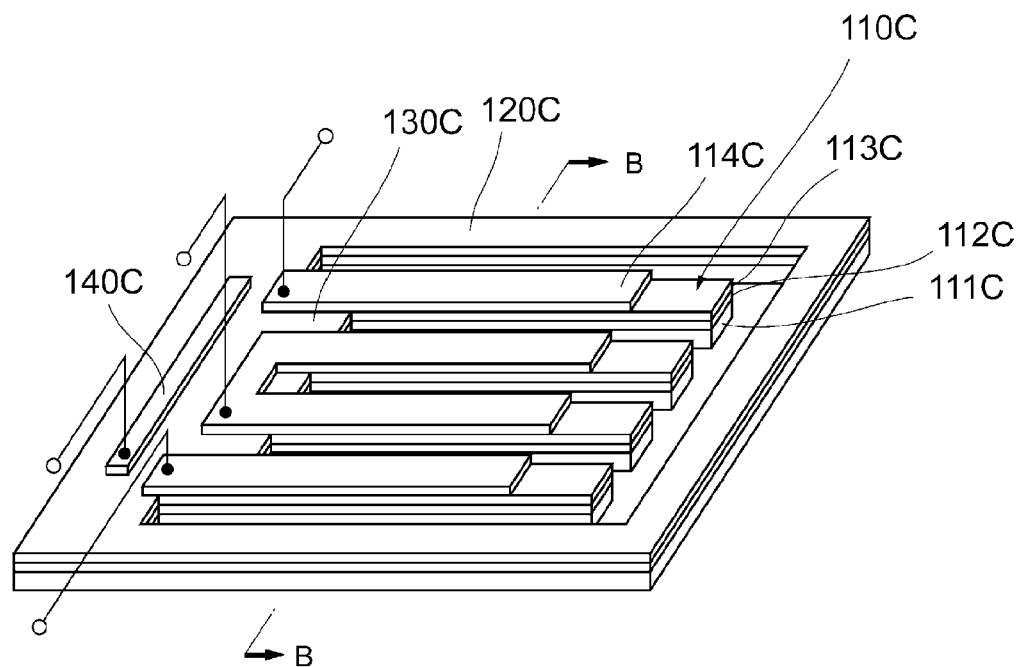
FIG. 10 is a perspective view illustrating a configuration of a piezoelectric resonator according to another embodiment.
Figure 11:
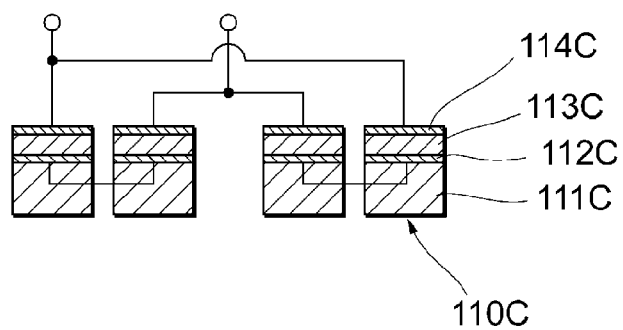
FIG. 11 is a cross-sectional view taken along line B-B in FIG. 10.

In the embodiments described above, an expansion vibration mode is adopted, in which the vibrating portion 110 having a rectangular shape is retained at both ends thereof by a pair of coupling portions 130. However, the present disclosure is not limited to such embodiments, and other vibration modes can be adopted. For example, FIG. 10 is a perspective view of another embodiment, and FIG. 11 is a cross-sectional view taken along line B-B in FIG. 10. As illustrated, a bending vibration mode can be adopted, in which vibrating portions 110C are formed by bending vibrators extending from a coupling portion 130C coupled to a retainer 120C.

Specifically, as illustrated in FIGS. 10 and 11, the coupling portion 130C is formed at one end of the retainer 120C in the shape of a rectangular frame, and a plurality of (four here) vibrating portions 110C, each formed by a stick-like bending vibrator, extend from the coupling portion 130C. The vibrating portions 110C each have a free end on one side opposite the side retained by the coupling portion 130C. The vibrating portions 110C are each formed by stacking a semiconductor layer 111C, a lower electrode 112C, a piezoelectric film 113C, and an upper electrode 114C. The upper electrodes 114C of two vibrating portions 110C in the center are integrally formed. As illustrated in FIG. 11, when the upper electrodes 114C of two vibrating portions 110C on the outer sides are short-circuited and a drive signal is applied between the two vibrating portions 110C in the center and the two vibrating portions 110C on the outer sides, out-of-plane bending vibration of the two vibrating portions 110C in the center and the two vibrating portions 110C on the outer sides occurs at opposite phases. A belt-like vibration suppressing portion 140C is formed on the retainer 120C on a side adjacent to the coupling portion 130C. Even in the piezoelectric resonator adopting this vibration mode, the same effects as those of the embodiments described above can be achieved.

The shape of the coupling portions 130 is not limited to the shapes described in the embodiments above, and the coupling portions 130 may have various other structures. For example, the configuration of the coupling portions 130 is not limited to one that connects the vibrating portion 110 to the retainer 120 at portions facing each other. The coupling portions 130 may each be bent in the middle, and may each connect the vibrating portion 110 to a portion of the retainer 120 not facing the point of connection between the vibrating portion 110 and the coupling portion 130.

The embodiments described above are intended to ease understanding of the present disclosure, and are not intended to limit interpretation of the present invention. The present invention can be changed or improved without departing from the spirit thereof, and the present invention includes equivalents thereof. That is, the embodiments appropriately changed in design by those skilled in art are also encompassed in the scope of the present invention, as long as they have the features of the present invention. For example, the elements included in the embodiments and their arrangements, materials, conditions, shapes, and sizes are not limited to illustrated ones and can be changed appropriately. Also, the elements included in the embodiments can be combined, as long as it is technically possible, and the resulting combinations are also encompassed in the scope of the present invention as long as they have the features of the present invention.

REFERENCE SIGNS LIST

100: piezoelectric resonator
110: vibrating portion
111: semiconductor layer
112: lower electrode
113: piezoelectric film
114: upper electrode
120: retainer
130: coupling portion
140: vibration suppressing portion
141: lower electrode
142: piezoelectric film
143: upper electrode

The invention claimed is:

1. A resonator comprising:
a vibrating member including a semiconductor layer, a first piezoelectric film disposed on the semiconductor layer, and a first upper electrode disposed on the first piezoelectric film;
a retainer forming a frame and configured to retain the vibrating member within the frame such that the vibrating member can vibrate;
at least one coupling member that couples the vibrating member to the retainer; and
a vibration suppressing member disposed on the retainer and including a second piezoelectric film and a second upper electrode disposed on the second piezoelectric film,
wherein the second upper electrode is electrically independent from the first upper electrode.

2. The resonator according to claim 1, wherein the vibrating member further comprises a first lower electrode disposed between the first piezoelectric film and the semiconductor layer.

3. The resonator according to claim 1, wherein the vibration suppressing member further comprises a second lower electrode disposed between the second piezoelectric film and the retainer.

4. The resonator according to claim 1, wherein the retainer is a degenerate semiconductor comprising silicon.

5. The resonator according to claim 1, wherein the first piezoelectric film comprises a same material as the second piezoelectric film and the first upper electrode comprises a same material as the second upper electrode.

6. The resonator according to claim 2,
wherein the vibration suppressing member further comprises a second lower electrode disposed between the second piezoelectric film and the retainer, and
wherein the first lower electrode comprises a same material as the second lower electrode.

7. The resonator according to claim 1, wherein the second upper electrode is grounded.

8. The resonator according to claim 1, wherein the second piezoelectric film has lower crystallinity than the first piezoelectric film.

9. The resonator according to claim 1, wherein the at least one coupling member comprises a pair of coupling members that each couple opposing sides of the vibrating member to the retainer.

10. The resonator according to claim 1, wherein the frame of the retainer comprises a rectangle shape have a pair of first sides and a pair of second sides extending in a direction perpendicular to the pair of first sides.

11. The resonator according to claim 10, wherein the at least one coupling member comprises a pair of coupling members that each couple opposing sides of the vibrating member to the pair of first sides of the retainer, respectively.

12. The resonator according to claim 11, wherein the vibration suppressing member extends in a lengthwise direction of one side of the pair of first sides of the retainer.

13. The resonator according to claim 12, wherein the pair of first sides of the retainer have a length that is shorter than the pair of second sides of the retainer.

14. The resonator according to claim 1, wherein the second upper electrode of the vibration suppressing member comprises a first linear electrode extending in a direction parallel to a side of the retainer and a plurality of second linear electrodes extending in a direction orthogonal to the first linear electrode.

15. A resonator comprising:
a vibrating member including a semiconductor layer, a first piezoelectric film disposed on the semiconductor layer, and a first upper electrode disposed on the first piezoelectric film;
a retainer forming a frame and configured to retain the vibrating member within the frame such that the vibrating member can vibrate;
at least one coupling member that couples the vibrating member to the retainer; and
a vibration suppressing member disposed on the retainer and including a second piezoelectric film and a second upper electrode disposed on the second piezoelectric film,
wherein the second upper electrode of the vibration suppressing member comprises a zig zag pattern disposed on the second piezoelectric film.

16. The resonator according to claim 1, wherein the vibrating member comprises a plurality of vibrating arms extending from the at least one coupling member in a direction parallel to each other.

17. A resonating device comprising:
a resonator including:
a vibrating member including a semiconductor layer, a first piezoelectric film disposed on the semiconductor layer, and a first upper electrode disposed on the first piezoelectric film,
a retainer forming a frame and configured to retain the vibrating member within the frame such that the vibrating member can vibrate,
at least one coupling member that couples the vibrating member to the retainer, and
a vibration suppressing member disposed on the retainer and including a second piezoelectric film and a second upper electrode disposed on the second piezoelectric film;
a cover configured to cover the resonator; and
at least one terminal disposed in the cover and electrically connected to the resonator wherein the second upper electrode is electrically independent from the first upper electrode.

18. The resonating device according to claim 17, wherein the at least one external terminal is disposed at a vertical position in a plan view of the resonating device that corresponds to the at least one coupling member, respectively.

19. The resonating device according to claim 17, further comprising an additional terminal disposed in the cover at a vertical position in a plan view of the resonating device that corresponds to the vibration suppressing member and that electrically connects the vibration suppressing member to a ground connection.

20. The resonating device according to claim 17, further comprising another cover having a cavity therein and coupled to the resonator on a side of the resonator opposite the cover.

* * * * *